(12) United States Patent
Yang et al.

(10) Patent No.: US 10,417,954 B2
(45) Date of Patent: Sep. 17, 2019

(54) DISPLAY PANEL AND DISPLAY DEVICE (71) Applicant: Xiamen Tianma Micro-Electronics Co., Ltd., Xiamen (CN)

(72) Inventors: Kangpeng Yang, Xiamen (CN); Yumin Xu, Xiamen (CN); Chao Zheng, Xiamen (CN); Shaofan Liu, Xiamen (CN); Xiaomeng Chen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 15/665,342

(22) Filed: Jul. 31, 2017

(65) Prior Publication Data
US 2017/0330503 A1 Nov. 16, 2017

(30) Foreign Application Priority Data

Mar. 15, 2017 (CN) .......................... 2017 1 0153127

(51) Int. Cl.
*G09G 3/3266* (2016.01)
*G09G 3/20* (2006.01)
*G09G 3/36* (2006.01)

(52) U.S. Cl.
CPC ......... *G09G 3/2092* (2013.01); *G09G 3/3266* (2013.01); *G09G 3/3677* (2013.01);
(Continued)

(58) Field of Classification Search
CPC .. G09G 3/2092; G09G 3/3266; G09G 3/3677; G09G 2310/0221;
(Continued)

(56) References Cited

U.S. PATENT DOCUMENTS

| 6,545,655 B1* | 4/2003 | Fujikawa | G09G 3/3611 345/87 |
| 8,502,948 B2* | 8/2013 | Su | G02F 1/136286 349/139 |
| 2013/0009938 A1* | 1/2013 | Hwang | G09G 3/348 345/212 |

FOREIGN PATENT DOCUMENTS

CN 1971353 A 5/2007
CN 104503179 A 4/2015
(Continued)

*Primary Examiner* — Carolyn R Edwards
(74) *Attorney, Agent, or Firm* — Kilpatrick Townsend & Stockton LLP (57) ABSTRACT

Provided is a display panel, including a plurality of gate lines extending in a row direction and arranged in a column direction; a plurality of data lines extending in a column direction and arranged in a row direction; a plurality of pixel units arranged in an array of M rows by N columns defined by the plurality of gate lines and the plurality of data lines intersecting each other; a first gate driver connected to pixel units from a first row to a mth row; and a second gate driver connected to pixel units from a (m+1)th row to a Mth row, where pixel units from the first row to the mth row of the nth column are connected to an integrated circuit through one of the plurality of data lines and pixel units from the (m+1)th row to the Mth row of the nth column are connected to the integrated circuit through another one of the plurality of data lines, where M, N, m and n are positive integers satisfying the following conditions: $1<m<M$ and $1<n<N$. Split-screen display is made possible. Different display areas can be driven simultaneously. The display panel can be refreshed at a frequency twice as before without affecting the charging duration of the display panel.

7 Claims, 4 Drawing Sheets (52) U.S. Cl.
CPC .............. *G09G 2300/0426* (2013.01); *G09G 2310/0205* (2013.01); *G09G 2310/0218* (2013.01); *G09G 2310/0221* (2013.01); *G09G 2310/08* (2013.01)

(58) Field of Classification Search
CPC ... G09G 2310/0218; G09G 2310/0205; G09G 2310/08; G09G 2300/0426
See application file for complete search history.

(56) References Cited

FOREIGN PATENT DOCUMENTS

| | | |
|---|---|---|
| CN | 106094383 A | 11/2016 |
| KR | 20120037845 A | 4/2012 |
| KR | 101251377 B1 | 4/2013 |

\* cited by examiner

DISPLAY PANEL AND DISPLAY DEVICE

CROSS-REFERENCES TO RELATED APPLICATIONS

This application claims priority to a Chinese patent application No. 201710153127.0 filed on Mar. 15, 2017, disclosure of which is incorporated herein by reference in its entirely.

TECHNICAL FIELD

The present disclosure relates to the display field, and particularly to a display panel and a display device.

BACKGROUND

Currently, commonly known flat panel displays (FPDs) include Liquid Crystal Display (LCD) panels and Organic Light Emitting Diode (OLED) display panels, both types of which have array substrates for driving pixel units to emit light. Array substrates are provided with a plurality of gate lines for supplying scanning signals, a plurality of data lines perpendicular to the plurality of gate lines for supplying data signals, and a plurality of pixel units arranged in areas defined by the plurality of gate lines and the plurality of data lines intersecting each other, where each of the plurality of pixel units is provided with a Thin Film Transistor (TFT) and a pixel electrode, where a gate electrode, a source electrode and a drain electrode of the TFT are respectively connected to one of the plurality of gate lines, one of the plurality data lines and the pixel electrode.

When a display panel is running, the plurality of gate lines are controlled by gate drivers and the plurality of data lines are controlled by source drivers, where the gate lines are turned on row by row under control of gate drive signals generated by the gate drivers, and data voltages of the corresponding rows generated by the source drives are sent to the corresponding pixel electrodes through data lines to charge the pixel electrodes, so that gray-scale voltages required for displaying each gray-scale are formed in the pixel electrodes and then each frame of image is displayed. Conventionally, most gate drivers are shifted in a single direction, that is, once a circuit starts running, the gate driver is usually shifted from the first gate line to the last gate line, each of the plurality of data lines intersects with the plurality of gate lines from the first row to the last row, and pixel units connected to different data lines are usually in same quantity and colors.

Conventionally, when the display panel is applied in virtual reality or augmented reality, the viewable area for the left eye and that for the right eye are usually different. To enhance visual effects, the refresh rate of the display panel usually needs to be improved to 120 Hz. After the improvement of the refresh rate, the charging period of the display panel is apparently squeezed, resulting in poor display quality, and especially as the display panel resolution is getting higher, the charging period becomes crucial to improvement of the display effect.

SUMMARY

An object of the present disclosure provides a display panel and a display device, making it possible to display in split-screen and drive different gate lines corresponding to different display areas simultaneously, so that a double refresh frequency, not affecting the charging duration of the display panel, can be achieve, and thereby the display panel of the present disclosure is better applicable to fields including virtual reality and augmented reality and capable of improving display effects.

According to an embodiment of the present invention, a display panel includes a plurality of gate lines extending in a row direction and arranged in a column direction; a plurality of data lines extending in a column direction and arranged in a row direction; a plurality of pixel units arranged in an array of M rows by N columns defined by the plurality of gate lines and the plurality of data lines intersecting each other; a first gate driver connected to pixel units from the first row to the mth row; and a second gate driver connected to pixel units from the (m+1)th row to the Mth row, where pixel units from the first row to the mth row of the nth column are connected to an integrated circuit through one of the plurality of data lines and pixel units from the (m+1)th row to the Mth row of the nth column are connected to the integrated circuit through another one of the plurality of data lines, where M, N, m and n are positive integers satisfying the following conditions: $1<m<M$ and $1<n<N$.

According to another embodiment of the present invention, a display device includes any one of the aforementioned display panel.

According to the display device and the display panel of the present disclosure, pixel units of the display panel are divided into two parts that are driven by different gate drivers respectively, and pixel units located in the same column and electrically connected to different gate drivers are electrically connected to different data lines respectively, and thereby two parts of the pixel units can be driven and display a picture separately and split-screen display can be performed. The two parts of pixel units are driven by different gate drivers separately so that the two gate drivers can operate simultaneously to achieve a double refresh rate without compressing the charging duration of the pixel units, and thereby the display panel has better display effects and can better apply to virtual reality and augmented reality.

DETAILED DESCRIPTION

The disclosure will be further described below with references to the accompanying drawings and embodiments. It should be noted that the following embodiments described herein are merely for explaining the present disclosure rather than limiting the present disclosure. Additionally, merely partial contents associated with the present disclosure rather than all contents are illustrated in the accompanying drawings for ease of description, and a same reference sign is used in different drawings.

Figure 1:
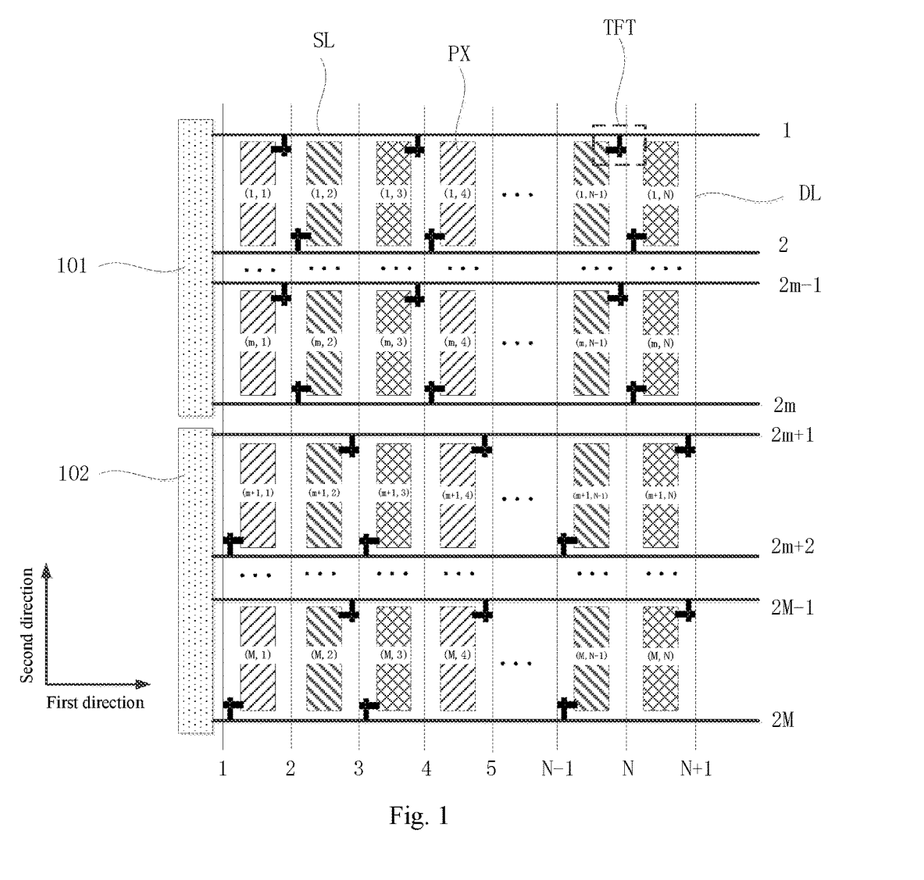
FIG. 1 is a schematic diagram showing a display panel according to an embodiment of the present invention.

FIG. 1 is a schematic diagram showing a display panel according to an embodiment of the present invention. As shown in FIG. 1, the display panel includes a plurality of gate lines (SLs) extending in a row direction and arranged in a column direction, a plurality of data lines (DLs) extending in a column direction and arranged in a row direction, a plurality of pixel units arranged in an array of M rows by N columns defined by the plurality of gate lines and the plurality of data lines intersecting each other, a first gate driver 101 connected to pixel units from the first row to the mth row; and a second gate driver 102 connected to pixel units from the (m+1)th row to the Mth row.

Pixel units from the first row to the mth row of the nth column are connected to an integrated circuit through one of the plurality of data lines, and pixel units from the (m+1)th row to the Mth row of the nth column are connected to the integrated circuit through another one of the plurality of data lines, where M, N, m and n are positive integers satisfying the following conditions: 1<m<M and 1<n<N.

The display panel of this embodiment can be either an LCD panel or an OLED panel, which is usually provided with an array substrate. The array substrate includes the plurality of pixel units with TFTs, where a TFT is electrically connected to one of the plurality of gate lines and one of the plurality of data lines and thereby electrically connected to a gate driver and a source driver. The gate driver electrically connected to gate electrodes of the TFTs functions as a switch for turning on and off one or more TFTs. When the gate electrode of one TFT is turned on, data signals generated by the source driver are sent to the pixel unit corresponding to the TFT through one data line.

Usually each of the plurality of gate lines (SLs) extends in the row direction (first direction in FIG. 1) and is arranged in the column direction (second direction in FIG. 1). Each of the plurality of data lines extends in the column direction and is arranged in the row direction. The plurality of pixel units are arranged in an array of M rows by N columns defined by the plurality of gate lines and the plurality of data lines intersecting each other. That is, the display panel includes M rows of pixel units, which are numbered 1, 2, . . . , m, m+1, . . . , M in turn, where m and M are positive integers that conform to formula 1<m<M; and the pixel units are further arranged in N columns, which are numbered 1, 2, . . . , n, . . . , N in turn, where n and N are positive integers that conform to formula 1<n<N.

As shown in FIG. 1, each of the plurality of pixel units in the array is marked with coordinates. For example, the pixel unit in the first row of the first column (m=1, n=1) is marked with (1, 1) in FIG. 1. Similarly, the pixel unit with coordinates (2, N) is located in the second row of the Nth column.

The plurality of gate lines and the plurality of data lines are marked in a similar way. Each of the plurality of data lines extends in the column direction (second direction in FIG. 1) and are arranged in the first direction shown in FIG. 1, and therefore the plurality of data lines extending along the first direction are marked with DL 1, DL 2, . . . , and so on. The plurality of gate lines extending along the second direction are marked with SL 1, SL 2, . . . , and so on.

The display panel according to this embodiment of the present disclosure further includes the first gate driver 101 connected to pixel units from the first row to the mth row and the second gate driver 102 connected to pixel units from the (m+1)th row to the Mth row.

Pixel units from the first row to the mth row of the nth column are connected to the integrated circuit through one of the plurality of data lines and pixel units from the (m+1)th row to the Mth row of the nth column are connected to the integrated circuit through another one of the plurality of data lines.

The First gate driver 101 and the second gate driver 102, which operate independently of each other, receive different start signals from the integrated circuit and thereby are independently driven. Among the pixel units in a same column, at least one of the pixel units (PXs) that are driven by the first gate driver 101 and other ones of the pixel units (PXs) that are driven by the second gate driver 102 are electrically connected to different data lines. As shown in FIG. 1, among pixel units in the second column, namely the pixel units with coordinates (1, 2), (2, 2), (M−1, 2) and (M, 2), pixel units with coordinates (1, 2) and (2, 2) electrically connected to the first gate driver 101 are connected to the data line (DL) 2 while pixel units with coordinates (M−1, 2) and (M, 2) electrically connected to the second gate driver 102 are connected to the data line (DL) 3. In this way, pixel units of the display panel are divided into two parts, which do not affect each other and are turned on separately and supplied with data signals separately.

It should be noted that although the display panel is divided into two parts, the display panel as a whole displays a complete image. The display panel according to this embodiment has a plurality of drive modes, which are given below.

1. The first gate driver 101 and the second gate driver 102 alternately refresh and drive the corresponding pixel units, that is, the first gate driver receives a first start signal and sequentially supplies gate drive signals to pixel units electrically connected to the first gate driver, and then the corresponding pixel units are turned on, receive data signals and then display images. When the first gate driver completes the refreshment, the second gate driver receives a second start signal and sequentially supplies gate drive signals to pixel units electrically connected to the second gate driver, and then the corresponding pixel units are turned on, receive data signals and then display images. This drive mode has the same refresh rate as that of the related art, which is typically 60 Hz, but can reduce power consumption of the display panel due to the alternate refreshment, so that this drive mode is usually applicable to display of static pictures not requiring high refresh rates.

2. The first gate driver 101 and the second gate driver 102 drive the corresponding pixel units simultaneously. The first gate driver 101 and the second gate driver 102 separately receive start signals simultaneously, and then the two parts of pixel units sequentially receive gate drive signals simultaneously and receive data signals from different data lines. When the two parts of pixel units equal in the number of rows, the scanning frequency of the display panel doubles to 120 Hz. Of course, this embodiment does not require that the two parts of pixel units equal in the number of rows. When the two parts of pixel units do not equal in the number of rows, the scanning frequency of the display panel depends on the refresh rate of the gate driver electrically connected to more rows of pixel units, in which case the refresh rate of the display panel still increases to a number greater than 60 Hz of the related art, thereby achieving better dynamic display.

3. The display panel is in half-screen display mode. Since the first gate driver and the second gate driver are driven separately, in some special display cases, for example, when the display panel is used in a cell phone where the display panel needs to display only time or notification bar at some points, only one of the gate drivers, that is, one of the first gate driver and the second gate driver, needs to operate, with the other one stopping scanning. Whereas, in the related art, such display mode can be achieved only when full-screen scanning is performed and the part not to be displayed in the display panel is supplied with black screen data signals. Compared with the work mode of the related art, the technical solution of this embodiment greatly reduces power consumption of the display panel and improves the refresh rate.

Optionally, in this embodiment, as shown in FIG. 1, there are (N+1) data lines sequentially extending along the first direction. Each of data lines 2 to N is electrically connected to pixel units (PXs) in two columns adjacent to the each of the data lines 2 to N. Among a row of pixel units, two pixel units electrically connected to a same data line are connected to different gate lines. As shown in FIG. 1, the data line #2 is electrically connected to pixel units (1, 1), (2, 1), (1, 2) and (2, 2), where the data line #2 is electrically connected to adjacent first column of pixel units, to which pixel units (1, 1) and (2, 1) belong, and to adjacent second column of pixel units, to which pixel units (1, 2) and (2, 2) belong. Additionally, pixel units, which are in a same row and electrically connected to a same data line, are connected to different gate lines, that is, pixel units (1, 1) and (1, 2), which are in the same row, are electrically connected to data line #1 and data line #2 respectively.

Optionally, odd-numbered data lines are electrically connected to pixel units from the first row to the mth row and even-numbered data lines are electrically connected to pixel units from the (m+1)th row to the Mth row; or even-numbered data lines are electrically connected to pixel units from the first row to the mth row and odd-numbered data lines are electrically connected to pixel units from the (m+1)th row to the Mth row.

As shown in FIG. 1, when the number of the plurality of data lines (DLs) is (N+1) and the number of columns of pixel units is N, any column of pixel units can be adjacent to two data lines, that is, the data lines are located along two sides of each column of pixel units and each of the data lines is located between two adjacent columns of pixel units. Each of data line #1 and data line (N+1) is electrically connected to only one column of pixel units, that is, data line #1 is electrically connected to the first column of pixel units, data line (N+1) is electrically connected to the Nth column of pixel units. Each of the data lines 2 to N is electrically connected to two columns of pixel units adjacent to each of the data lines 2 to N. In this case, to make sure that among each column of pixel units, pixel units electrically connected to the first gate driver and pixel units electrically connected to the second gate driver are connected to different data lines, the odd-numbered data lines can be electrically connected to pixel units from the first row to the mth row, that is, pixel units electrically connected to the first gate driver are electrically connected to the odd-numbered data lines, that is, pixel units from the first row to the mth row are electrically connected to only the odd-numbered data lines such as data line #1, data line #3, data line #5, . . . , and so on, and similarly, pixel units from the (m+1)th row to the Mth row are electrically connected to only the even-numbered data lines such as data line #2, data line #4, data line #6, . . . , and so on.

Therefore, it is impossible that two pixel units connected to a same gate line are connected to a same data line and two pixel units connected to a same data line are connected to a same gate line. The mode of using a data line to connect two columns of pixel units adjacent to this data line makes the number of data lines used to realize split-screen display as less as possible, thus reducing difficulty in design of integrated circuits and complexity in operation of the display panel. According to this embodiment of the present invention, each column of pixel units is divided into two parts, which are electrically connected to different data lines respectively, and each of the data lines 2 to N is electrically connected to two columns of pixel units adjacent to the data line, so that split-screen display is possible with no extra data lines added.

It should be noted that the quantity of the plurality of gate lines are not limited in the above embodiment and just need to meet the requirements that two of pixel units, arranged in a same row and electrically connected to a same data line, are electrically connected to different gate lines, while among pixel units in the same row, pixel units electrically connected to different data lines can be electrically connected to either a same gate line or different gate lines.

Optionally, a total number of gate lines is 2M, pixel units from the first row to the mth row are connected to the first gate driver through the first to a 2mth gate lines, and pixel units from the (m+1)th row to the Mth row are connected to the second gate driver through the (2m+1)th to 2Mth gate lines; and among pixel units in a same row, at least one of the pixel units is electrically connected to one of the gate lines and other ones of the pixel units are electrically connected to another one of the gate lines.

FIG. 1 shows the display panel with a total number of 2M gate lines, that is, the gate lines are twice of the number of the pixel units. Since each of the data lines 2 to N is electrically connected to two columns of pixel units adjacent to the each of the data lines 2 to N, to ensure that two pixel units in a same row and electrically connected to a same data line are electrically connected to different gate lines, it is necessary to add more gate lines so that data signals of each pixel unit are supplied separately. Moreover, pixel units in a same row and electrically connected to different data lines can be electrically connected to a same gate line, by which the gate lines are actually twice the number of rows of the pixel units, thus realizing split-screen display with fewest possible flat cables. In this embodiment, doubled gate lines will not affect flat cables of the display panel. Optionally, two of the gate lines are arranged between two adjacent rows of pixel units, and two of the gate lines electrically connected to a same row of pixel units are located along two sides of the same row of pixel units respectively.

Taking alternately refreshing and driving the pixel units by first gate driver 101 and second gate driver 102 as an example, the drive process of the display panel according to this embodiment is as follows: the first gate driver 101 receives a start signal and sequentially turns on pixel units from the first row to the mth row through gate lines 1 to 2m, and data signals are supplied to two pixel units in a same row and electrically connected to a data line through the data line, where the data line is one of the odd-numbered data lines, such as data line #1, data line #3, . . . , and so on. Since the two pixel units in a same row are turned on and off under control of different gate lines, each of the two pixel units is driven separately, making upper-half-screen display possible. When the first gate driver 101 completes the refreshment, the second gate driver 102 receives a start signal and sequentially turns on pixel units from the (m+1) row to the Mth row through gate lines (2m+1) to M, and then data signals are supplied to pixel units through each of the even-numbered data lines, such as data line #2, data line #4, . . . , and so on, making lower-half-screen display possible. When the first gate driver and the second gate driver drive the pixel units simultaneously, the two parts of pixel units are turned on simultaneously, and data signals are supplied to pixel units electrically connected to the first gate driver through the odd-numbered data lines, while data signals are supplied to pixel units electrically connected to the second gate driver through the even-numbered data lines, so as to double the refresh rate of the display panel as a whole.

In this embodiment, the pixel units can be electrically connected to the gate lines in multiple ways. As shown in FIG. 1, among pixel units in a same row, pixel units in the odd-numbered columns and pixel units in the even-numbered columns are electrically connected to different gate lines, for example, among pixel units (1, 1), (1, 2), (1, 3) and (1, 4) in the first row, pixel units (1, 1) and (1, 3) in the odd-numbered column are electrically connected to data line #1, while pixel units (1, 2) and (1, 4) in the ever-numbered column are electrically connected to data line #2.

Figure 2:
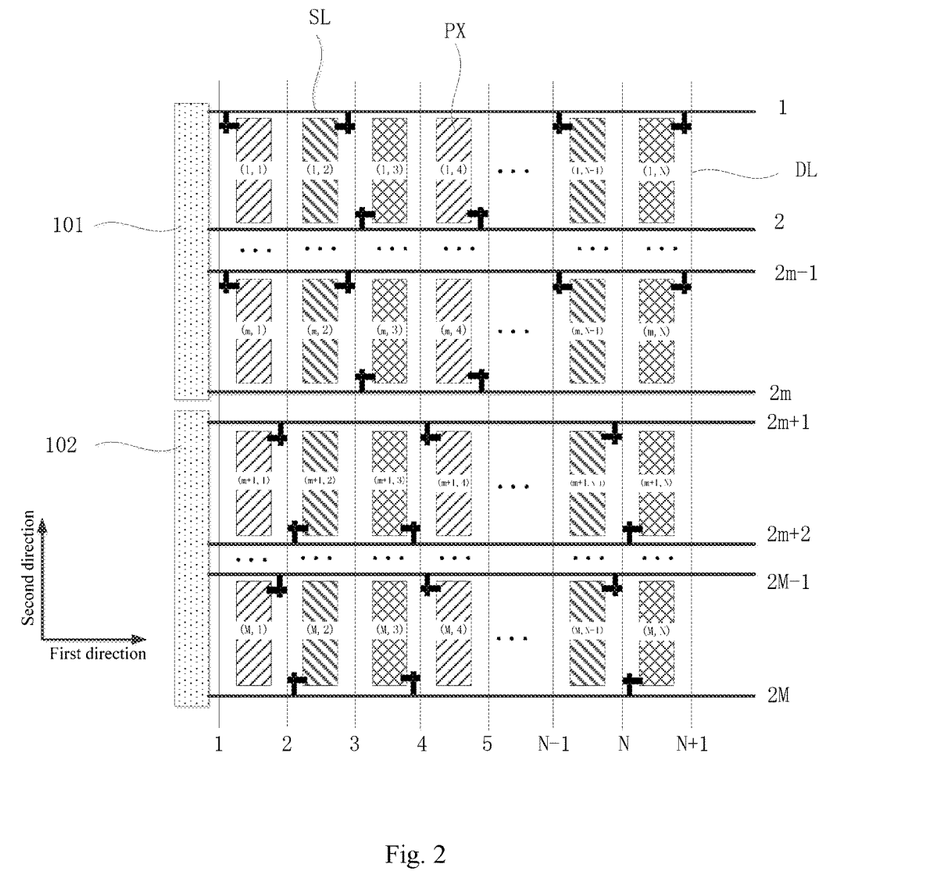
FIG. 2 is a schematic diagram showing a display panel according to another embodiment of the present invention.

The pixel units can also be electrically connected to the gate lines in other ways. Specifically, FIG. 2 is a schematic diagram showing a display panel according to another embodiment of the invention. As shown in FIG. 2, among pixel units (1, 1), (1, 2), (1, 3) and (1, 4) in the first row, pixel units (1, 1) and (1, 2) are electrically connected to data line #1 while pixel units (1, 3) and (1, 4) are electrically connected to data line #2, where pixel units (1, 2) and (1, 3) are electrically connected to the same data line. In this embodiment, among pixel units in a same row, every two pixel units adjacent to each other are connected to a same gate line and are called a pixel unit group, where every two pixel unit groups adjacent to each other are connected to different gate lines while every two pixel unit groups, between which there is one pixel unit group, are connected to a same gate line. This connection mode is different from the connection mode where odd-numbered columns of pixel units and even-numbered columns of pixel units are electrically connected to different gate lines respectively.

Figure 3:
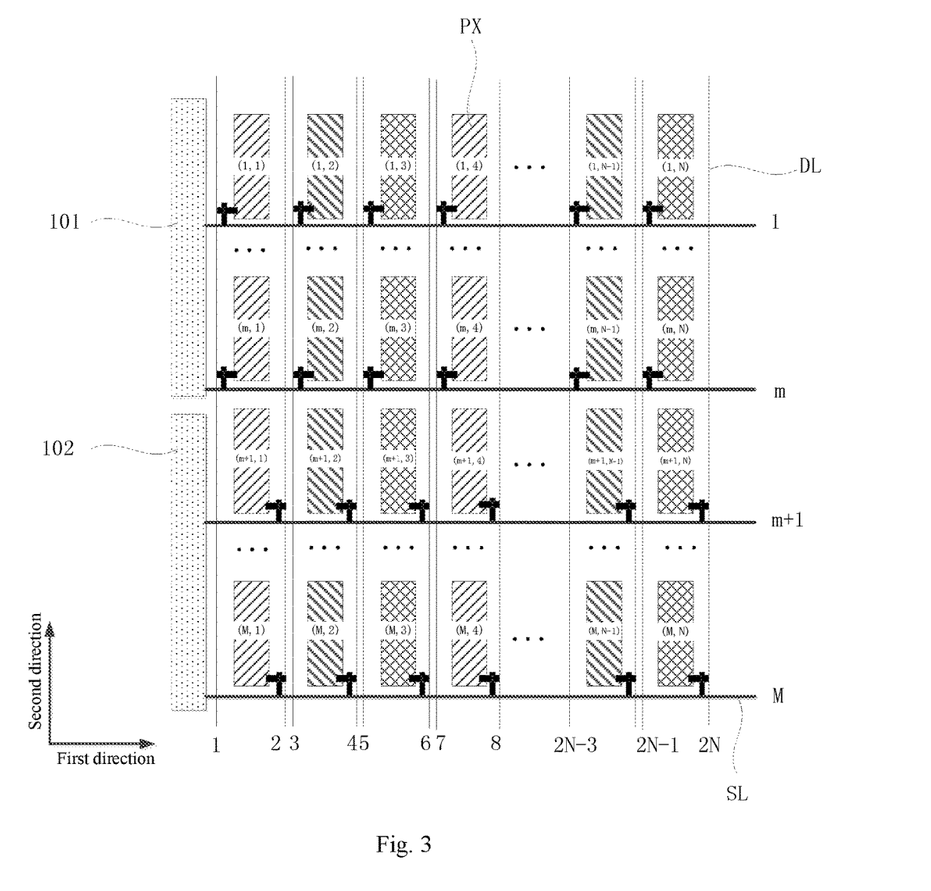
FIG. 3 is a schematic diagram showing a display panel according to another embodiment of the present invention.

FIG. 3 is a schematic diagram showing a display panel according to another embodiment of the invention. As shown in FIG. 3, the number of the gate lines is M and the number of the data lines is 2N, that is, the number of the gate lines equals the number of rows of the pixel units while the number of data lines is twice of the number of the columns of the pixel units, where each row of pixel units is electrically connected to one of the gate lines and split-screen display is achieved with data lines added while with no gate lines added. As shown in FIG. 3, the pixel units from the first row to the mth row are connected to the first gate driver 101 through data line #1 to gate line m respectively while the pixel units from the (m+1)th row to the Mth row are connected to the second gate driver 102 through gate line (m+1) to gate line M respectively. Each data line (DL is electrically connected to only one column of pixel units.

Optionally, odd-numbered data lines are electrically connected to pixel units from the first row to the mth row and even-numbered data lines are electrically connected to pixel units from the (m+1)th row to the Mth row; or even-numbered data lines are electrically connected to pixel units from the first row to the mth row and odd-numbered data lines are electrically connected to pixel units from the (m+1)th row to the Mth row.

Taking alternately refreshing and driving the pixel units by the first gate driver 101 and the second gate driver 102 as an example, the drive process of the display panel according to this embodiment is as follows: the first gate driver 101 receives a start signal and sequentially turns on pixel units from the first row to the mth row through gate lines 1 to m, and then each of the odd-numbered data lines such as data line #1, data line #3, . . . sequentially supplies data signals to two pixel units in a same row and electrically connected to this data line, making upper-half-screen display possible. When the first gate driver 101 completes the refreshment, the second gate driver 102 receives a start signal and sequentially turns on pixel units from the (m+1) row to the Mth row through gate lines (m+1) to M, and then each of the even-numbered data lines such as data line #2, data line #4, . . . sequentially supplies data signals, making lower-half-screen display possible. When the first gate driver and the second gate driver drive the pixel units simultaneously, the two parts of pixel units are turned on simultaneously, and the odd-numbered data lines supply data signals to pixel units electrically connected to the first gate driver while the even-numbered data lines supply data signals to pixel units electrically connected to the second gate driver, doubling the refresh rate of the display panel as a whole.

Optionally, when M, which is the number of rows of the pixel units, is an odd number, the formula $m=(M\pm1)/2$ applies. When M, which is the number of rows of the pixel units, is an even number, the formula $m=M/2$ applies, in which case, the display panel as a whole can be divided into two parts with approximately the same number of pixel units, that is, the display panel as a whole can be divided into two split screens in the same size or in the approximate same size, which are driven separately and display an image separately. The ways the pixel units are divided are not limited to those listed in this embodiment. It is also feasible to electrically connect pixel units from the first row to the ⅓Mth row to the first gate driver and electrically connect pixel units from the (⅓M+1)th row to the Mth row to the second gate driver. The actual division mode depends on product requirements.

Figure 4:
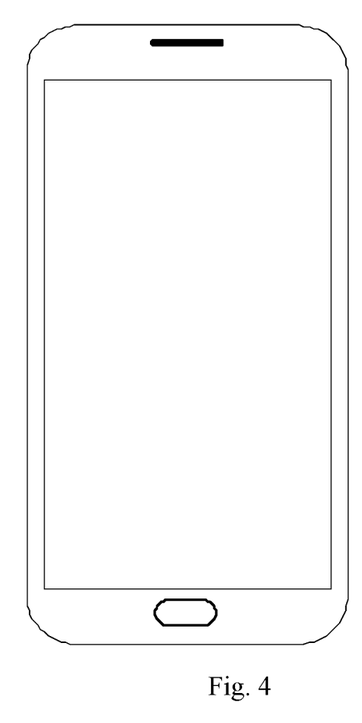
FIG. 4 is a schematic diagram showing a display device according to an embodiment of the present invention.

According to another embodiment of the present invention, a display device is provided, and a schematic diagram of the display device is shown in FIG. 4. As shown in FIG. 4, the display device, which includes any one of the display panels described in the aforementioned embodiments, may be a cellphone, desktop, notebook, tablet or electronic album. The display device according to this embodiment includes any one of the display panels described in the aforementioned embodiments, and therefore has the advantages of that included display panel.

For the display device and the display panel according to the present disclosure, pixel units of the display panel are divided into two parts that are driven by different gate drivers respectively, and pixel units located in a same column and electrically connected to different gate drivers are electrically connected to different data lines respectively, by which two parts of the pixel units can be driven and displayed separately and split-screen display can be performed. The two parts of pixel units are driven by different gate drivers separately and therefore at least three drive modes are given below: the first gate driver and the second gate driver alternately refresh and drive the pixel units, which is usually applicable to display of static pictures not requiring high refresh rates since power consumption of the display panel is reduced in this mode; the first gate driver and the second gate driver drive the pixel units simultaneously, which is particularly applicable to virtual reality and augmented reality since the refresh rate of the display panel as a whole doubles and hysteresis like trailing will not exist in dynamic display in this mode; and the display panel is in half-screen display mode, where compared with the work mode of the related art by which the part not to be displayed is supplied with black screen data signals, the technical solution of the half-screen display mode greatly reduces overall power consumption of the display panel and improves the refresh rate.

What is claimed is:

1. A display panel, comprising:
a plurality of gate lines extending in a row direction and sequentially arranged in a column direction, which are numbered sequentially;
a plurality of data lines extending in a column direction and sequentially arranged in a row direction, which are numbered sequentially;
a plurality of pixel units arranged in an array of M rows and N columns defined by the plurality of gate lines and the plurality of data lines intersecting each other, the plurality of pixel units arranged in M rows are numbered from 1 to M sequentially, and the plurality of pixel units arranged in N rows are numbered from 1 to N sequentially, the plurality of pixel units in one column are disposed between two adjacent data lines, wherein a pixel unit group is formed by every two pixel units directly adjacent to each other electrically connected to a same gate line, every two adjacent pixel unit groups are electrically connected to different gate lines, every two pixel unit groups between which one pixel unit group is disposed are electrically connected to a same gate line;
a first gate driver connected to pixel units from a first row to a mth row; and
a second gate driver connected to pixel units from a (m+1)th row to a Mth row, wherein a total number of the plurality of data lines is (N+1), the total number of the plurality of data lines is greater than a column number of the plurality of pixel units, a difference of the total number of the plurality of data lines and the column number of the plurality of pixel units is one, pixel units from the first row to the mth row of the nth column are connected to an integrated circuit through one of the plurality of data lines and pixel units from the (m+1)th row to the Mth row of the nth column are connected to the integrated circuit through another one of the plurality of data lines, wherein each of data lines 2 to N is electrically connected to pixel units in two columns adjacent to the each of the data lines 2 to N, and two pixel units, which are in a same row and electrically connected to a same data line, are connected to different gate lines;
wherein M, N, m and n are positive integers that conform to formulas 1<m<M and 1<n<N.

2. The display panel according to claim 1, wherein
odd-numbered data lines are electrically connected to pixel units from the first row to the mth row and even-numbered data lines are electrically connected to pixel units from the (m+1)th row to the Mth row; or
even-numbered data lines are electrically connected to pixel units from the first row to the mth row and odd-numbered data lines are electrically connected to pixel units from the (m+1)th row to the Mth row.

3. The display panel according to claim 1, wherein
a total number of gate lines is 2M, pixel units from the first row to the mth row are connected to the first gate driver through the first to 2mth gate lines, and pixel units from the (m+1)th row to the Mth row are connected to the second gate driver through the (2m+1)th to 2Mth gate lines; and
among pixel units in a same row, at least one of the pixel units is electrically connected to one of the gate lines and other ones of the pixel units are electrically connected to another one of the gate lines.

4. The display panel according to claim 3, wherein
two of the gate lines are arranged between two adjacent rows of pixel units, and two of the gate lines electrically connected to the same row of pixel units are located along two sides of the same row of pixel units respectively.

5. The display panel according to claim 3, wherein
among pixel units in a same row, pixel units in the odd-numbered columns and pixel units in the even-numbered columns are electrically connected to different gate lines.

6. The display panel according to claim 1, wherein
when M is an odd number, the formula m=(M±1)/2 applies; and
when M is an even number, the formula m=M/2 applies.

7. A display device, comprising:
a display panel, comprising:
a plurality of gate lines extending in a row direction and sequentially arranged in a column direction, which are numbered sequentially;
a plurality of data lines extending in a column direction and sequentially arranged in a row direction, which are numbered sequentially;
a plurality of pixel units arranged in an array of M rows and N columns defined by the plurality of gate lines and the plurality of data lines intersecting each other, the plurality of pixel units arranged in M rows are numbered from 1 to M sequentially, and the plurality of pixel units arranged in N rows are numbered from 1 to N sequentially, the plurality of pixel units in one column are disposed between two adjacent data lines, wherein a pixel unit group is formed by every two pixel units directly adjacent to each other electrically connected to a same gate line, every two adjacent pixel unit groups are electrically connected to different gate lines, every two pixel unit groups between which one pixel unit group is disposed are electrically connected to a same gate line;
a first gate driver connected to pixel units from a first row to a mth row; and
a second gate driver connected to pixel units from a (m+1)th row to a Mth row, wherein a total number of the plurality of data lines is (N+1), the total number of the plurality of data lines is greater than a column number of the plurality of pixel units, a difference of the total number of the plurality of data lines and the column number of the plurality of pixel units is one, pixel units from the first row to the mth row of the nth column are connected to an integrated circuit through one of the plurality of data lines and pixel units from the (m+1)th row to the Mth row of the nth column are connected to the integrated circuit through another one of the plurality of data lines, wherein each of data lines 2 to N is electrically connected to pixel units in two columns adjacent to the each of the data lines 2 to N, and two pixel units, which are in a same row and electrically connected to a same data line, are connected to different gate lines;
wherein M, N, m and n are positive integers that conform to formulas 1<m<M and 1<n<N.

* * * * *